(12) United States Patent
Suzuki et al.

(10) Patent No.: US 8,148,788 B2
(45) Date of Patent: Apr. 3, 2012

(54) SEMICONDUCTOR DEVICE AND METHOD OF MANUFACTURING THE SAME

(75) Inventors: Akira Suzuki, Ota (JP); Naofumi Tsuchiya, Ota (JP); Koujiro Kameyama, Ota (JP)

(73) Assignees: SANYO Semiconductor Co., Ltd., Ora-gun (JP); SANYO Semiconductor Manufacturing Co., Ltd., Ojiya-shi (JP); Semiconductor Components Industries, LLC, Phoenix, AZ (US)

( * ) Notice: Subject to any disclaimer, the term of this patent is extended or adjusted under 35 U.S.C. 154(b) by 130 days.

(21) Appl. No.: 12/538,635

(22) Filed: Aug. 10, 2009

(65) Prior Publication Data

US 2010/0052090 A1   Mar. 4, 2010

(30) Foreign Application Priority Data

Sep. 4, 2008 (JP) ................. 2008-227180

(51) Int. Cl.
*H01L 21/762* (2006.01)
(52) U.S. Cl. .......... 257/409; 257/510; 257/E29.02; 257/E21.548; 438/427
(58) Field of Classification Search .......... 257/487, 257/491, 496, 510, 409, 513, E29.02, E21.546, 257/E21.548; 438/221, 296, 359, 427
See application file for complete search history.

(56) References Cited

U.S. PATENT DOCUMENTS

| | | | | |
|---|---|---|---|---|
| 3,984,859 A | * | 10/1976 | Misawa et al. | 257/495 |
| 4,819,054 A | | 4/1989 | Kawaji et al. | |
| 5,661,329 A | * | 8/1997 | Hiramoto et al. | 257/510 |
| 6,439,514 B1 | * | 8/2002 | Yamaguchi et al. | 257/500 |

FOREIGN PATENT DOCUMENTS

| | | |
|---|---|---|
| JP | 2003-347306 | 12/2003 |
| KR | 1990-0007149 | 9/1990 |
| KR | 1999-0070937 | 9/1999 |

\* cited by examiner

*Primary Examiner* — Victor A Mandala
*Assistant Examiner* — Scott Stowe
(74) *Attorney, Agent, or Firm* — Morrison & Foerster LLP

(57) ABSTRACT

The invention is directed to reduction of a manufacturing cost and enhancement of a breakdown voltage of a PN junction portion abutting on a guard ring. An N− type semiconductor layer is formed on a front surface of a semiconductor substrate, and a P type semiconductor layer is formed thereon. An insulation film is formed on the P type semiconductor layer. Then, a plurality of grooves, i.e., a first groove, a second groove and a third groove are formed from the insulation film to the middle of the N− type semiconductor layer in the thickness direction thereof. The plurality of grooves is formed so that one of the two grooves next to each other among these, that is closer to an electronic device, i.e., to an anode electrode, is formed shallower than the other located on the outside of the one. Then, an insulating material is deposited in the first groove, the second groove and the third groove. The lamination body of the semiconductor substrate and the layers laminated thereon is then diced along dicing lines.

9 Claims, 7 Drawing Sheets

SEMICONDUCTOR DEVICE AND METHOD OF MANUFACTURING THE SAME

CROSS-REFERENCE OF THE INVENTION

This application claims priority from Japanese Patent Application No. 2008-227180, the content of which is incorporated herein by reference in its entirety.

BACKGROUND OF THE INVENTION

1. Field of the Invention

The invention relates to a semiconductor device and a method of manufacturing the same.

2. Description of the Related Art

A high-power mesa diode has been conventionally known as one of semiconductor devices. A conventional mesa diode will be described referring to FIG. 8.

An N− type semiconductor layer 111 is formed on the front surface of an N+ type semiconductor substrate 110. A P type semiconductor layer 112 is formed on the front surface of the N− type semiconductor layer 111, and an insulation film 113 is formed on the P type semiconductor layer 112. An anode electrode 114 electrically connected to the P type semiconductor layer 112 is further formed.

A mesa groove 117 is formed from the front surface of the P type semiconductor layer 112, reaching the N− type semiconductor layer 111. The mesa groove 117 is formed deeper than the N− type semiconductor layer 111, and the bottom thereof is located in the N+ type semiconductor substrate 110. The width W7 of the mesa groove 117 is 50 to 100 μm, for example, and the depth is about 100 μm, for example. An insulating material 118 is deposited in the mesa groove 117 so as to cover the sidewall thereof. This mesa groove 117 functions as a so-called guard ring. The mesa diode is surrounded by the mesa groove 117 and has a mesa structure. A cathode electrode (not shown) is formed on the back surface of the semiconductor substrate 110.

A mesa semiconductor device is described in Japanese Patent Application Publication No. 3985582.

However, in the mesa diode described above, when the insulating material 118 is deposited in the mesa groove 117, the insulating material 118 is deposited on and near the bottom of the mesa groove 117 more than needed, and on the other hand, it is formed thinner than desired on the sidewall of the mesa groove 117 in regions 117C at and near the PN junction portion of the N− type semiconductor layer 111 and the P type semiconductor layer 112. This causes a problem of reducing the breakdown voltage at the PN junction portion in the mesa groove 117 that functions as the guard ring.

To address this, it is conceived that the process of depositing the insulating material in the groove is repeated several times so as to provide the insulating material 118 with enough thickness at the end on the sidewall of the mesa groove 117 in the regions 117C at and near the PN junction portion.

However, this method causes complex processes and increases the processing time, and also makes it difficult to form the insulating material 118 stably with desired accuracy. Furthermore, it causes a problem of largely increasing the amount of the insulating material 118 deposited in the mesa groove 117 more than the amount usually needed. As a result, the manufacturing cost of the mesa diode is increased.

SUMMARY OF THE INVENTION

The invention provides a semiconductor device that includes a semiconductor substrate, a semiconductor layer formed on the semiconductor substrate, an electronic device formed in the semiconductor layer, and a guard ring formed in the semiconductor layer so as to surround the electronic device in plan view of the semiconductor device. The guard ring includes a plurality of grooves formed in the semiconductor layer so as to surround the electronic device in the plan view of the semiconductor device, an insulating material is deposited in each of the grooves, and the depths of the grooves are different from each other.

The invention also provides a method of manufacturing a semiconductor device. The method includes forming a semiconductor layer on a semiconductor substrate, forming an electronic device in the semiconductor layer, and forming a plurality of grooves in the semiconductor layer so as to surround the electronic device in plan view of the semiconductor device. The grooves have depths different from each other. The method further includes depositing an insulating material in each of the grooves to form a guard ring comprising the grooves having the insulating material therein, and dicing the semiconductor substrate and the semiconductor layer along a dicing line provided outside the guard ring.

The invention further provides a semiconductor device that includes a plurality of electronic devices formed in a semiconductor layer, and an element isolation layer formed in the semiconductor layer so as to isolate an electronic device from another electronic device. The element isolation layer includes a plurality of grooves formed in the semiconductor layer, and an insulating material is deposited in each of the grooves.

DETAILED DESCRIPTION OF THE INVENTION

Figure 1:
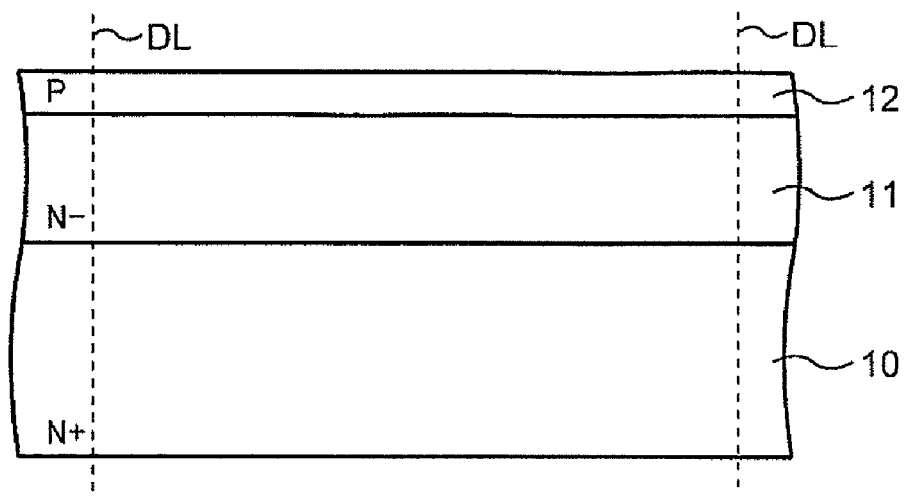
FIGS. 1, 2, 4 and 6 are cross-sectional views showing a mesa diode and a method of manufacturing the same of a first embodiment of the invention.
Figure 2:
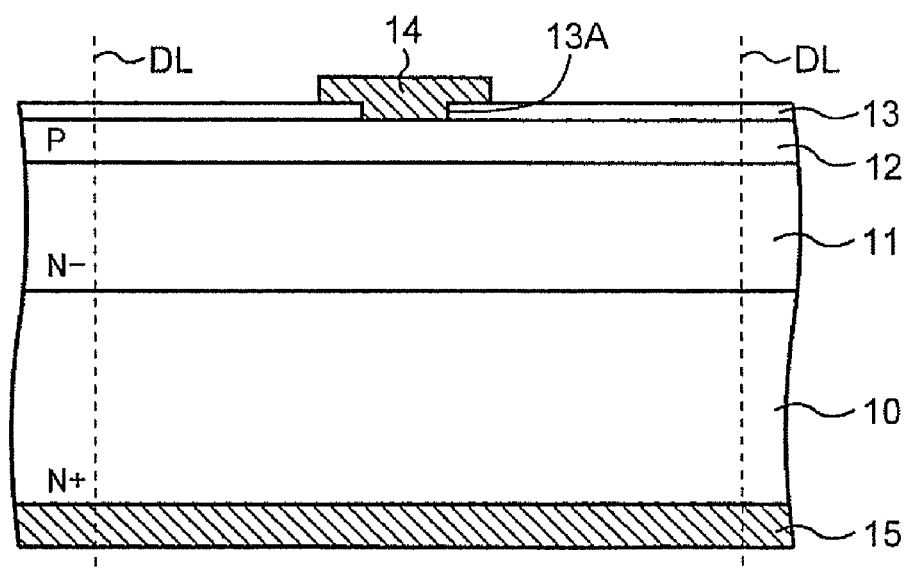
Figure 4:
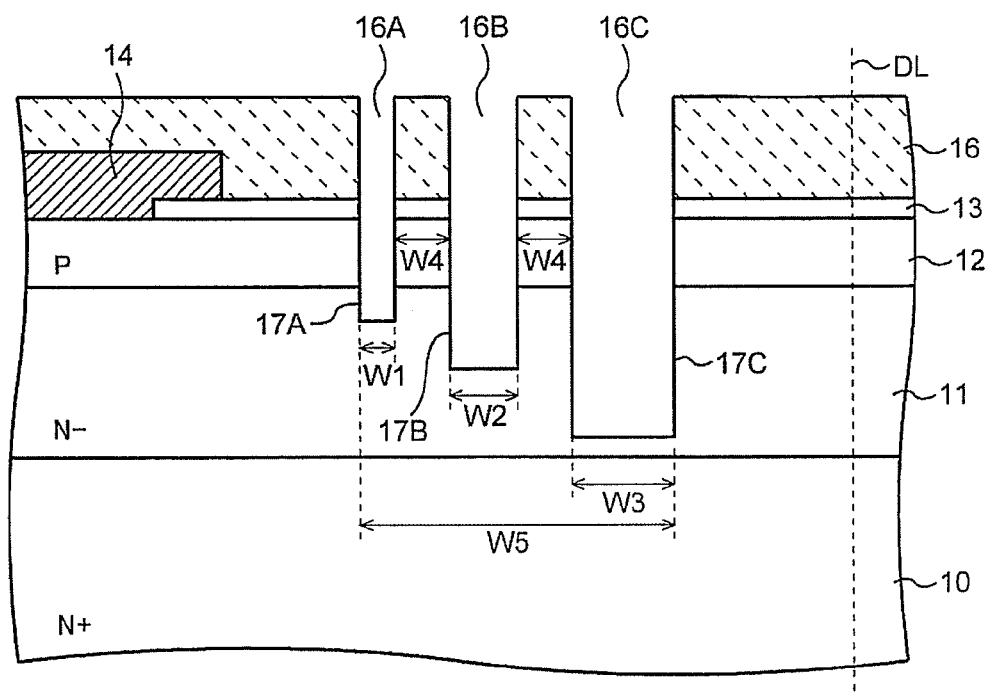
Figure 6:
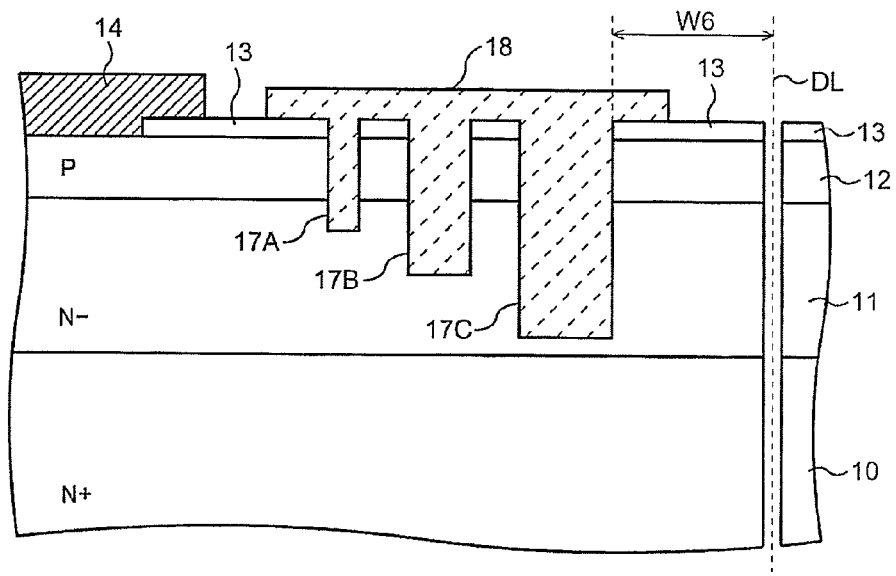

A semiconductor device and a method of manufacturing the same of a first embodiment of the invention will be described. This embodiment uses a mesa diode as an example. FIGS. 1, 2, 4 and 6 are cross-sectional views showing the mesa diode and the method of manufacturing the same of the embodiment. FIGS. 1 and 2 mainly show a semiconductor wafer in a region for forming one of a plurality of mesa diodes to be formed thereon. FIGS. 4 and 6 show a partially enlarged view of FIGS. 1 and 2 near a dicing line DL.

Figure 3:
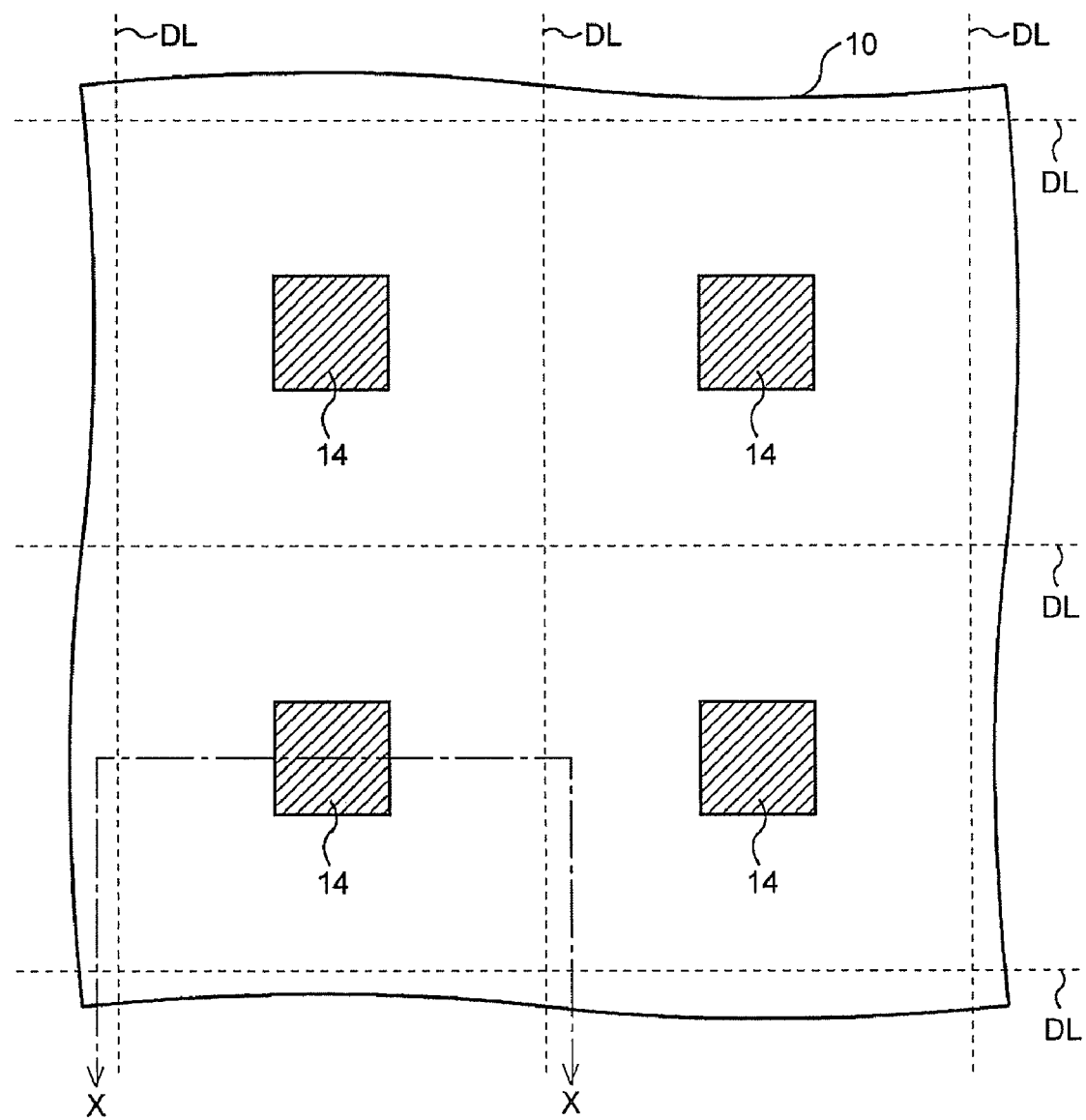
FIGS. 3 and 5 are plan views showing the mesa diode and the method of manufacturing the same of the first embodiment of the invention.
Figure 5:
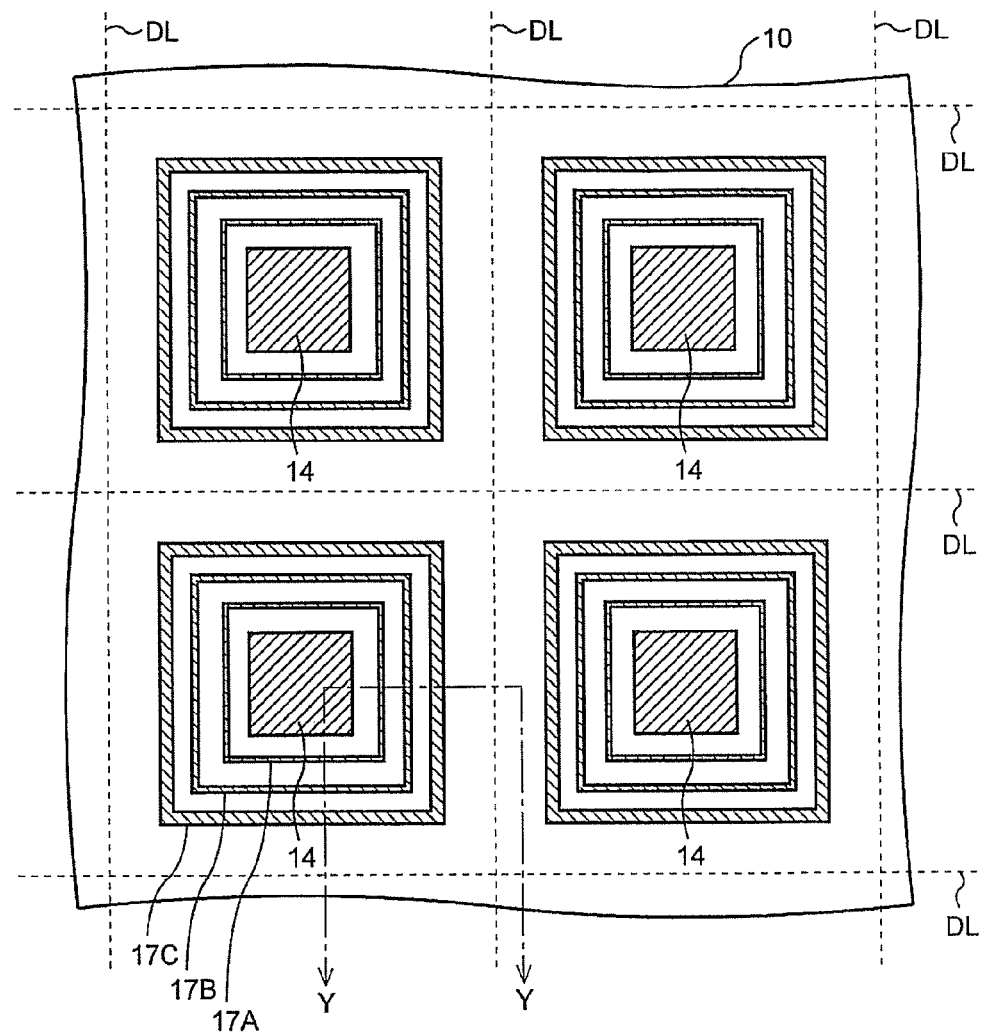

Furthermore, FIGS. 3 and 5 are plan views showing the mesa diode and the method of manufacturing the same of the embodiment of the invention, and show a portion of a region for forming the plurality of mesa diodes. A cross-section of FIG. 3 along line X-X corresponds to the cross-sectional views of FIGS. 1 and 2, and a cross-section of FIG. 5 along line Y-Y corresponds to the cross-sectional views of FIGS. 4 and 6.

As shown in FIG. 1, an N+ type semiconductor substrate 10 made of, for example, single crystal silicon is provided. A high concentration of N-type impurities such as phosphorus, for example, is diffused in the semiconductor substrate 10. Then, a low concentration N type semiconductor layer, i.e., an N− type semiconductor layer 11 is formed on the front surface of this semiconductor substrate 10 by epitaxial growth of a semiconductor layer. The N− type semiconductor layer 11 may be other impurity diffused region than the above, that is formed by diffusing impurities in the front surface of the semiconductor substrate 10. Then, P type impurities such as, for example, boron are diffused in the front surface of the N− type semiconductor layer 11 to form a P type semiconductor layer 12. By this, a PN junction portion is formed in the interface of the N− type semiconductor layer 11 and the P type semiconductor layer 12. In the structure described above, the total thickness of the semiconductor substrate 10, the N− type semiconductor layer 11 and the P type semiconductor layer 12 is about 200 μm, for example. It is noted that conductivity types such as N+, N and N− belong in one general conductivity type, and conductivity types such as P+, P and P− belong in another general conductivity type.

Then, as shown in FIG. 2, an insulation film 13 such as a silicon oxide film is formed on the front surface of the P type semiconductor layer 12 by, for example, a thermal oxidation method or a CVD method. Then, the insulation film 13 is partially etched using a mask to form an opening 13A in the insulation film 13, that exposes a part of the P type semiconductor layer 12. This opening 13A is formed in a part of the region surrounded by the dicing lines DL and for forming the mesa diode.

Then, an anode electrode 14 connected to the P type semiconductor layer 12 through the opening 13A of the insulation film 13 is formed. The anode electrode 14 is made of a conductive material such as aluminum, and formed by a sputtering method, a vapor deposition method or the like. On the other hand, a cathode electrode 15 made of a conductive material such as aluminum is formed on the back surface of the semiconductor substrate 10 by the same method as that for the anode electrode 14. The positions of the anode electrodes 14 are as shown in the plan view of FIG. 3. At this time, in the region at and near the anode electrode 14, an electronic device is formed under the anode electrode 14, i.e., a diode including the PN junction portion between the N− type semiconductor layer 11 and the P type semiconductor layer 12.

Then, as shown in FIG. 4, a resist layer 16 having a plurality of openings is formed on the insulation film 13. The plurality of openings of the resist layer 16 is located in a region between the end of the anode electrode 14 and the dicing lines DL. Although the number of these openings is not limited, the description will be given using the example figures of a case that there are three openings, i.e., a first opening 16A, a second opening 16B and a third opening 16C.

Among the plurality of openings of the resist layer 16, i.e., the first opening 16A, the second opening 16B and the third opening 16C, one of the two openings next to each other, that is closer to the anode electrode 14, has a smaller width than the other on the outside of the one. In detail, the width W1 of the first opening 16A is smaller than the width W2 of the second opening 16B, and the width W2 of the second opening 16B is smaller than the width W3 of the third opening 16C (W1<W2<W3). Even when the number of the openings is different from the above, the relation among the widths is the same as the above.

Then, the insulation film 13 is first etched and removed using this resist layer 16 as a mask, and then by, preferably, a Bosch process under a given condition the P type semiconductor layer 12 is etched and the N− type semiconductor layer 11 is etched to the middle thereof in the thickness direction to form a first groove 17A, a second groove 17B and a third groove 17C. This Bosch process repeats an etching step of performing anisotropic dry-etching and a protection film formation step of forming a protection film on the sidewall of the groove formed by the anisotropic dry-etching.

The positional relation among the first groove 17A, the second groove 17B and the third groove 17C in plan view is as shown in FIG. 5. In detail, the first groove 17A, the second groove 17B and the third groove 17C are sequentially formed from the anode electrode 14 side toward the outside, as a triple annular groove.

Although the number of the grooves is three in the example figures, the invention is not limited to this and there may be two grooves or four or more grooves corresponding to the number of the openings of the resist layer 16. Furthermore, the formation of these grooves may be performed by other method than the Bosch process, e.g., an anisotropic etching process that is performed by appropriately controlling the pressure environment.

As shown in FIGS. 4 and 5, among the first groove 17A, the second groove 17B and the third groove 17C, one of the two grooves next to each other, that is closer to the anode electrode 14, is formed shallower than the other on the outside of the one. In detail, the first groove 17A is shallower than the second groove 17B, and the second groove 17B is shallower than the third groove 17C. Even when the number of the grooves is different from the above, the relation among the depths of these grooves is the same as the above.

In the whole cross-sectional view to see the depths of the first groove 17A, the second groove 17B and the third groove 17C, the plurality of grooves gradually shallows toward the anode electrode 14.

This relation among the depths of the first groove 17A, the second groove 17B and the third groove 17C is reflected by the size relation among the widths W1, W2 and W3 of the first opening 16A, the second opening 16B and the third opening 16C of the resist layer 16 used as the mask for the etching, and obtained by a so-called microloading effect. Therefore, the formation of the plurality of grooves, i.e., the first groove 17A, the second groove 17B and the third groove 17C is achieved by one etching process without a need of complex processes, and the manufacturing cost is prevented from increasing.

In detail, as the structure for obtaining the effect described above, the width W1 of the first groove 17A, the width W2 of the second groove 17B and the width W3 of the third groove 17C are preferably about 3 μm, about 5 μm, and about 10 μm, respectively. In this case, the interval W4 of the grooves is about 5 μm. The total width W5 of the region from the first groove 17A to the third groove 17C is smaller than a width W7 of a conventional mesa groove 117, i.e., smaller than about 50 to 100 μm.

The depths of the first groove 17A, the second groove 17B and the third groove 17C in this case are in the ranges of about 5 to 10 μm, about 15 to 20 μm, and about 30 to 40 μm, respectively. It is preferable that the deepest third groove 17C reaches near the boundary of the semiconductor substrate 10 and the N− type semiconductor layer 11.

These widths and depths of the first groove 17A, the second groove 17B and the third groove 17C are realized more certainly by the Bosch process described above than by other method.

Then, as shown in FIG. 6, an insulating material 18 is deposited in the first groove 17A, the second groove 17B and the third groove 17C. The insulating material 18 partially or completely fills the first groove 17A, the second groove 17B and the third groove 17C so as to cover the regions at and near the PN junction portion of the P type semiconductor layer 12 and the N− type semiconductor layer 11 and extend onto a part of the insulation film 13.

This insulating material 18 is made of, for example, a polyimide type organic material, and formed by an applying method such as a printing method, or by other method. Instead of this, the insulating material 18 may be made of, for example, an inorganic film or an inorganic material such as a silicon oxide film, a silicon nitride film or the like, and formed by a CVD method or other method. The example figures show the insulating material 18 that completely fills each of the grooves.

Furthermore, in the case that the insulating material 18 is made of an organic material, since the organic material shrinks when it is set, a concave may be formed in the insulating material 18 near the opening of each of the grooves depending on the deposition condition, different from the example figure, and the inside of each of the grooves is filled with the insulating material 18 partially and not completely. However, in this case, too, the region at and near the PN junction portion of the P type semiconductor layer 12 and the N− type semiconductor layer 11 in each of the grooves is covered enough by the insulating material 18.

The width and depth of each of these first groove 17A, second groove 17B and third groove 17C are smaller than those of the conventional mesa groove, as described above. Therefore, the coverage of the insulating material 18 is enhanced more than conventional in the region at and near the PN junction portion of the P type semiconductor layer 12 and the N− type semiconductor layer 11 in each of the first groove 17A, the second groove 17B and the third groove 17C.

Preferably, the insulating material 18 on the insulation film 13 is formed so as to continuously cover all of the first groove 17A, second groove 17B and third groove 17C, and one of the two ends is located at a closer position to the anode electrode 14 than to the first groove 17A, and the other is located at a closer position to the dicing lines DL than to the third groove 17C.

In this manner, a guard ring having the plurality of grooves, i.e., the first groove 17A, the second groove 17B and the third groove 17C filled with the insulating material 18 is formed, surrounding the electronic device configured as a diode.

Then, the lamination body of the semiconductor substrate 10 and the layers laminated thereon is diced along the dicing lines DL and separated into a plurality of mesa diodes.

The guard ring formed in this mesa diode prevents the insulating material 18 from failing to cover the region at and near the PN junction portion between the P type semiconductor layer 12 and the N− type semiconductor layer 11 in each of the first groove 17A, the second groove 17B and the third groove 17C, unlike the conventional device. This prevents the reduction of the breakdown voltage of the PN junction portion at the guard ring.

Furthermore, when such a guard ring is formed, it is not necessary to, like in the conventional device, repeat the process of depositing the insulating material in the mesa groove in order to form the insulating material thick at the PN junction portion at the mesa groove forming the guard ring. This avoids complex processes and a long processing time, and makes it possible to form the insulating material easily and stably with desired accuracy.

Furthermore, since the width and depth of each of the plurality of grooves of the embodiment, i.e., the first groove 17A, the second groove 17B and the third groove 17C are smaller than those of the conventional mesa groove, the amount of the insulating material deposited in all the grooves is largely smaller than the insulating material deposited in the conventional mesa groove. As a result, the manufacturing cost of the mesa diode is decreased compared with the conventional one.

Figure 8:
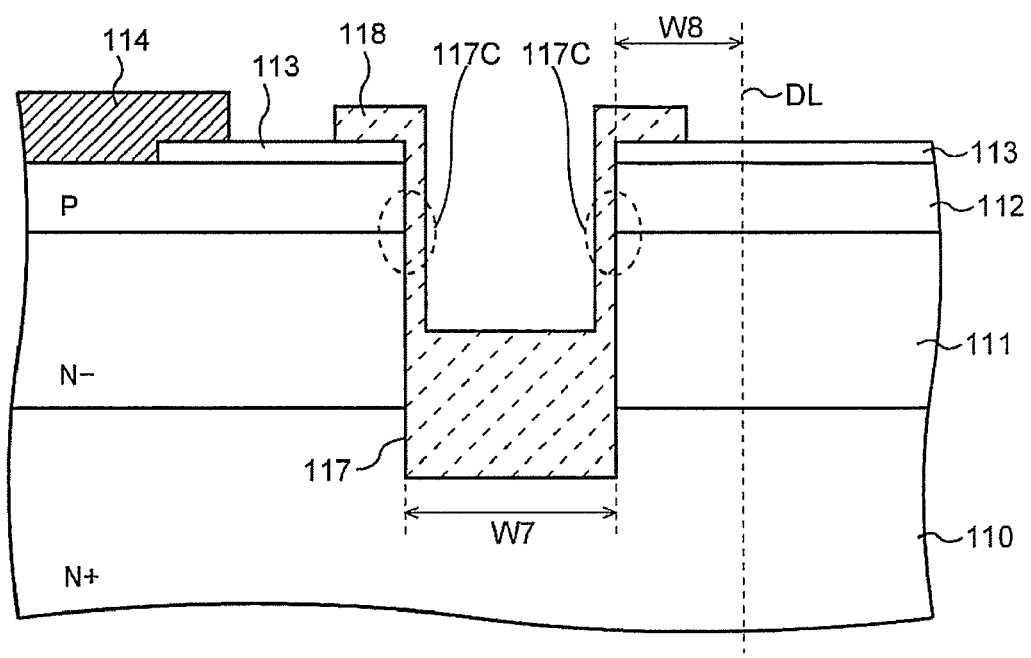
FIG. 8 is a cross-sectional view of a conventional mesa diode.

Furthermore, the distance W6 between the end of the groove that forms the guard ring of the embodiment, i.e., the end of the outermost third groove 17C, and the dicing line DL is larger than the distance W8 between the end of the mesa groove 117 that forms the conventional guard ring shown in FIG. 8 and the dicing line DL. This is realized because the total width W5 of the region from the first groove 17A to the third groove 17C is smaller than the width W7 of the conventional mesa groove. Therefore, in the mesa diode of the embodiment, since the strength of the outer end of the third groove 17C becomes higher than the conventional one, the resistance to a mechanical impact from outside is enhanced. Furthermore, by the amount of the difference between the width W5 and the width W7, the planar size of the mesa diode as one die is decreased, compared with the conventional one.

Furthermore, in the guard ring of the embodiment, the first groove 17A, the second groove 17B and the third groove. 17C gradually shallow toward the anode electrode 14. Therefore, when a higher voltage is applied to the anode electrode 14 than to the cathode electrode 15 to apply a forward bias to the PN junction portion, a region that makes a forward current flow from the anode electrode 14 to the cathode electrode 15 is secured enough under each of the bottoms of the first groove 17A, the second groove 17B and the third groove 17C. Since this region that makes a forward current flow exists circularly along the outer circumference of the mesa diode, this contributes to an increase of a current extracted from the cathode electrode 15.

When a higher voltage is applied to the cathode electrode 15 than to the anode electrode 14 to apply a reverse bias to the PN junction portion, a depletion layer expands from the N− type semiconductor layer 11 toward the semiconductor substrate 10 and further toward the damaged layer of the surface cut along the dicing lines DL. It is known that a leakage current occurs between the N− semiconductor layer 11 and the damaged layer mentioned above if the depletion layer expanding from the N-semiconductor layer 11 reaches the damaged layer mentioned above. However, the outermost groove of the guard ring of the embodiment, i.e., the third groove 17C having the largest width and depth prevents the depletion layer from reaching the damaged layer of the surface cut along the dicing lines DL from the N-semiconductor layer 11. This prevents the leakage current mentioned above when a reverse bias is applied.

Figure 7:
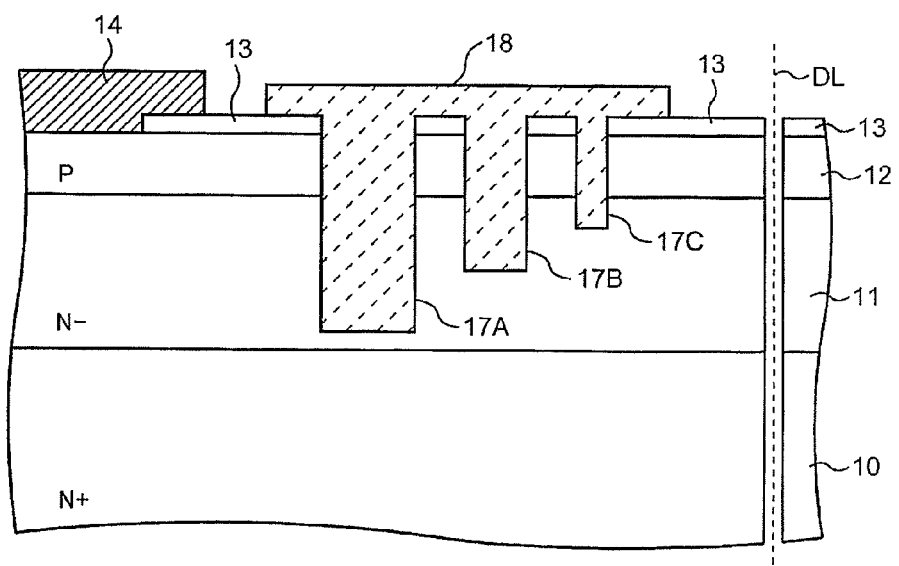
FIG. 7 is a cross-sectional view showing a mesa diode and a method of manufacturing the same of a second embodiment of the invention.

The plurality of grooves forming the guard ring of the embodiment, i.e., the first groove 17A, the second groove 17B and the third groove 17C may be positioned in the reverse depth order to the above. This case will be described as a second embodiment of the invention referring to FIG. 7. FIG. 7 is a cross-sectional view showing a mesa diode and a method of manufacturing the same of the embodiment, and shows the same region as that of FIG. 6.

In this embodiment, among the first groove 17A, the second groove 17B and the third groove 17C, one of the two grooves next to each other, that is closer to the anode electrode 14, is formed deeper than the other on the outside of the one. In detail, the first groove 17A is deeper than the second groove 17B, and the second groove 17B is deeper than the third groove 17C. The number of the grooves may be different from the above, and the relation among the depths of the grooves in this case is the same as the above. In the same manner to the first embodiment, the insulating material 18 is deposited in the first groove 17A, the second groove 17B and the third groove 17C and extends onto the outside of these grooves.

In this case, the first opening 16A, the second opening 16B and the third opening 16C are positioned in the reverse width order to the above in the resist layer 16 used for forming the grooves. The other structure and processes are the same as those of the first embodiment.

In the guard ring of the embodiment, the first groove 17A, the second groove 17B and the third groove 17C are formed so as to gradually deepen toward the anode electrode 14 in the whole cross-sectional view.

Therefore, compared with the first embodiment, when a forward bias is applied, under each of the bottoms of the first groove 17A, the second groove 17B and the third groove 17C, a region that makes a forward current flow from the anode electrode 14 toward the cathode electrode 15 becomes small.

However, on the other hand, when a reverse bias is applied, since the groove that is closest to the diode is the first groove 17A having the largest width and depth, a depletion layer is prevented from expanding toward the damaged layer of the surface cut along the dicing lines DL more certainly than in the first embodiment. It means that when a reverse bias is applied a leakage current is prevented more certainly than in the first embodiment. Excepting this, the same effect as that of the first embodiment is obtained.

The invention is not limited to the embodiments described above, and a modification is possible within the scope of the invention.

For example, although the first groove 17A, the second groove 17B and the third groove 17C are formed to the middle of the N− type semiconductor layer 11 in the thickness direction in the first and second embodiments described above, the invention is not limited to this and applicable to a case that some or all of the grooves are formed deeper than the N− type semiconductor layer 11.

Furthermore, although the first groove 17A, the second groove 17B and the third groove 17C are formed so as to gradually shallow or deepen toward the anode electrode 14 in the whole cross-sectional view in the first and second embodiments, the invention is not limited to this. In detail, the first groove 17A, the second groove 17B and the third groove 17C do not necessarily shallow or deepen gradually as long as the depths are different from each other.

Furthermore, the conductive types of the N+ type semiconductor substrate 10, the N− type semiconductor layer 11 and the P type semiconductor layer 12 in the first and second embodiments may be reversed.

Furthermore, although the description of the first and second embodiments is given using a mesa diode as an example, the invention is applicable to other semiconductor device. For example, the invention is applicable to a mesa bipolar transistor, a mesa MOSFET, a mesa IGBT, a mesa thyristor and so on. For example, in a case of a mesa bipolar transistor, the structure of an NPN type bipolar transistor is obtained by further providing an N type semiconductor layer on the front surface of the P type semiconductor layer 12.

Alternatively, the invention may be applied to a semiconductor device in which a semiconductor layer is formed on a semiconductor substrate and a plurality of electronic devices (not limited to a diode) is formed in the semiconductor layer. In this structure, an element isolation layer is formed in the semiconductor layer along the boundary of the electronic devices. This element isolation layer has a plurality of grooves that is similar to the first groove 17A, the second groove 17B and the third groove 17C described above and an insulating material deposited in the grooves. It is noted that the width or depth of each of the grooves may be all the same or different from each other.

Figure 9:
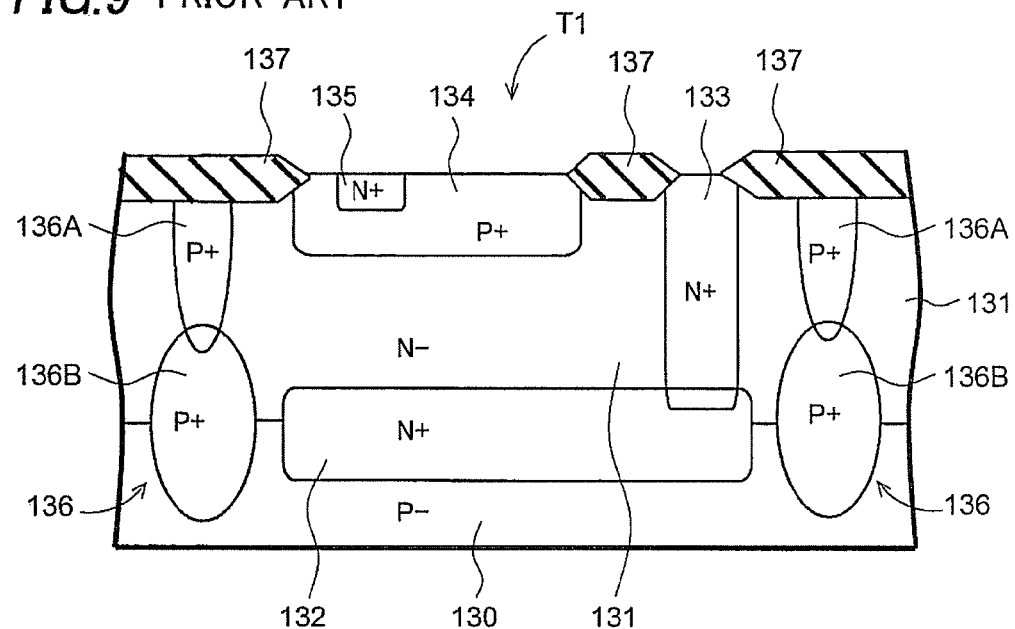
FIG. 9 is a cross-sectional view of a conventional semiconductor device in which a bipolar transistor is formed.

An example of a semiconductor device in this case is given. The plurality of electronic devices is formed as bipolar transistors of a type that makes an electric current flow in the semiconductor substrate in the thickness direction. A conventional bipolar transistor of this type is shown in FIG. 9. In FIG. 9, one of the plurality of bipolar transistors is shown for convenience of a description.

For example, an N− type semiconductor layer 131 is formed on the front surface of a P− type semiconductor substrate 130 by an epitaxial growth method, and a first collector layer 132 made of an N+ type impurity diffusion layer is formed in a portion of the boundary between the semiconductor substrate 130 and the N− type semiconductor layer 131. A second collector layer 133 is formed in the N− type semiconductor layer 131 from the front surface thereof to the first collector layer 132. A base layer 134 made of an P+ type impurity diffusion layer is formed on a portion of the front surface of the N− type semiconductor layer 131, and an emitter layer 135 made of an N+ type impurity diffusion layer is formed on a portion of the front surface of the base layer 134. When the bipolar transistor T1 of this structure is turned on, an electric current flows in the N− type semiconductor layer 131 in the thickness direction from the base layer 134 to the first collector layer 132, and the electric current is extracted from the second collector layer 133. These form an NPN type bipolar transistor T1.

Furthermore, an element isolation region 136 made of a P+ type impurity diffusion layer 136A, 136B is formed so as to surround the region where this bipolar transistor T1 is formed and extend in the thickness direction of the semiconductor substrate 130 and the N− type semiconductor layer 131. Furthermore, an element isolation film 137 made of a LOCOS oxide film is formed so as to surround the region where the bipolar transistor T1 is formed.

Figure 10:
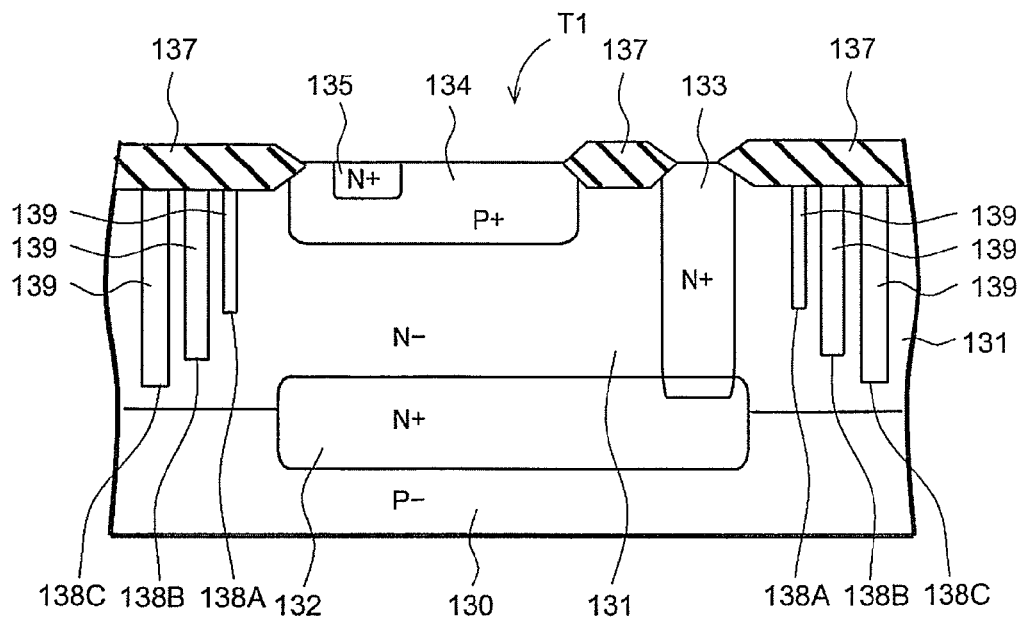
FIG. 10 is a cross-sectional view showing a semiconductor device of a modification of the invention.

When the invention is applied to this bipolar transistor T1, as shown in FIG. 10, an element isolation layer including a plurality of grooves 138A, 138B and 138C and an insulating material 139 filling the grooves is formed instead of the element isolation region 136 made of the impurity diffusion layers 136A, 136B. The other structure is the same as that of FIG. 9. The plurality of grooves 138A, 138B and 138C and the insulating material 139 are formed in the same manner to the first groove 17A, the second groove 17B and the third groove 17C and the insulating material 18 in the first and second embodiments. In the embodiment shown in FIG. 10, grooves 138A-138C do not reach semiconductor substrate 130 of the P− type. However, grooves 138A-138C are configured to prevent currents from flowing into another transistor formed next to bipolar transistor T1, or at least to reduce such currents significantly. Of course, some of the grooves may reach semiconductor substrate 130 of the P− type.

FIG. 10 shows the case that the element isolation film 137 made of a LOCOS oxide film is formed, but the formation of this element isolation film 137 may be omitted. In FIG. 10, the plurality of grooves 138A, 138B and 138C is formed in the N− type semiconductor layer 131 only, but the invention is not limited to this, and may be formed deeper than the N− type semiconductor layer 131 and extend into the P− type semiconductor substrate 130.

With this structure, particularly when the bipolar transistor T1 is a high breakdown voltage transistor, a breakdown voltage is high enough at the element isolation, and thus the element isolation is certainly effected. The invention is not limited to the bipolar transistor T1, and is also applicable to any semiconductor device in which other electronic device is formed.

In the semiconductor device and the method of manufacturing the same of the invention, since the insulating material is deposited in the grooves with high coverage, the breakdown voltage of the PN junction portion in the guard ring including the plurality of annular grooves is enhanced or the breakdown voltage of the PN junction portion in the grooves forming the element isolation layer is enhanced.

Furthermore, since the repetition of the process of depositing the insulating material in the groove, that has been needed conventionally, is not necessary, the process of forming the guard ring or the element isolation layer as described above is simplified, and further the amount of the insulating material deposited in the grooves forming the guard ring or the like is minimized, compared with the conventional device. Furthermore, there is no need to consider the accuracy or stability when the insulating material is deposited in the grooves, unlike the conventional device. As a result, the manufacturing cost is prevented from increasing.

Furthermore, in the semiconductor device and the method of manufacturing the same of the invention, in the case that the plurality of grooves forming the guard ring is formed so as to gradually shallow toward the electronic device, the region that makes a forward current flow when a forward bias is applied is secured enough under the guard ring.

Furthermore, in the case that the plurality of grooves is formed so as to gradually deepen toward the electronic device, when a reverse bias is applied, the innermost groove prevents the depletion layer from the semiconductor layer from reaching the damaged layer of the surface cut along the dicing lines. This prevents a leakage current between the semiconductor layer and the damaged layer.

What is claimed is:

1. A semiconductor device comprising:
a semiconductor substrate;
a semiconductor layer formed on the semiconductor substrate;
an electronic device formed in the semiconductor layer; and
a guard ring formed in the semiconductor layer so as to surround the electronic device in plan view of the semiconductor device,
wherein the guard ring comprises a plurality of grooves formed in the semiconductor layer so as to surround the electronic device in the plan view of the semiconductor device, an insulating material is deposited in each of the grooves, the depths of the grooves are different from each other, and each of the grooves penetrates through the semiconductor layer, and
a first groove of the grooves is formed next to a second groove of the grooves, the electronic device is closer to the first groove than to the second groove, and the first groove is narrower than the second groove.

2. The semiconductor device of claim 1, wherein the first groove is shallower than the second groove.

3. A semiconductor device comprising:
a semiconductor substrate;
a semiconductor layer formed on the semiconductor substrate;
an electronic device formed in the semiconductor layer; and
a guard ring formed in the semiconductor layer so as to surround the electronic device in plan view of the semiconductor device,
wherein the guard ring comprises a plurality of grooves formed in the semiconductor layer so as to surround the electronic device in the plan view of the semiconductor device, an insulating material is deposited in each of the grooves, the depths of the grooves are different from each other, and a first groove of the grooves is formed next to a second groove of the grooves, the electronic device is closer to the first groove than to the second groove, and the first groove is deeper than the second groove.

4. A semiconductor device comprising:
a semiconductor substrate;
a semiconductor layer formed on the semiconductor substrate;
an electronic device formed in the semiconductor layer; and
a guard ring formed in the semiconductor layer so as to surround the electronic device in plan view of the semiconductor device,
wherein the guard ring comprises a plurality of grooves formed in the semiconductor layer so as to surround the electronic device in the plan view of the semiconductor device, an insulating material is deposited in each of the grooves, the depths of the grooves are different from each other, and the insulating material fills each of the grooves at least partially so as to cover at least the semiconductor layer in each of the grooves, and extends outside the grooves so as to cover a portion of a top surface of the semiconductor layer.

5. A method of manufacturing a semiconductor device, comprising:
forming a semiconductor layer on a semiconductor substrate;
forming an electronic device in the semiconductor layer;
forming a plurality of grooves in the semiconductor layer so as to surround the electronic device in plan view of the semiconductor device and to penetrate through the semiconductor layer, the grooves having depths different from each other;
depositing an insulating material in each of the grooves to form a guard ring comprising the grooves having the insulating material therein; and
dicing the semiconductor substrate and the semiconductor layer along a dicing line provided outside the guard ring,
wherein a first groove of the grooves is formed next to a second groove of the grooves, the electronic device is closer to the first groove than to the second groove, and the first groove is narrower than the second groove.

6. The method of claim 5, wherein the first groove is shallower than the second groove.

7. A method of manufacturing a semiconductor device, comprising:
forming a semiconductor layer on a semiconductor substrate;
forming an electronic device in the semiconductor layer;
forming a plurality of grooves in the semiconductor layer so as to surround the electronic device in plan view of the semiconductor device, the grooves having depths different from each other;
depositing an insulating material in each of the grooves to form a guard ring comprising the grooves having the insulating material therein; and
dicing the semiconductor substrate and the semiconductor layer along a dicing line provided outside the guard ring,
wherein a first groove of the grooves is formed next to a second groove of the grooves, the electronic device is closer to the first groove than to the second groove, and the first groove is deeper than the second groove.

8. A method of manufacturing a semiconductor device, comprising:

forming a semiconductor layer on a semiconductor substrate;

forming an electronic device in the semiconductor layer;

forming a plurality of grooves in the semiconductor layer so as to surround the electronic device in plan view of the semiconductor device, the grooves having depths different from each other;

depositing an insulating material in each of the grooves to form a guard ring comprising the grooves having the insulating material therein; and dicing the semiconductor substrate and the semiconductor layer along a dicing line provided outside the guard ring, wherein the insulating material fills each of the grooves at least partially so as to cover at least the semiconductor layer in each of the grooves, and extends outside the grooves so as to cover a portion of a top surface of the semiconductor layer.

9. The method of claim 5, wherein the forming of the grooves in the semiconductor layer comprises a Bosch process.

* * * * *